(12) United States Patent
Morelle et al.

(10) Patent No.: US 8,916,963 B2
(45) Date of Patent: Dec. 23, 2014

(54) POWER MODULE FOR AN AUTOMOBILE

(75) Inventors: Jean-Michel Morelle, Beaugency (FR);
Ky Lim Tan, Maisons-Alfort (FR);
Laurent Vivet, Bois D'arcy (FR);
Sandra Dimelli, Bois D'arcy (FR);
Stéphane Thomelin, Richebourg (FR);
Hervé Lorin, Coignieres (FR); Patrick Dubus, Saint Forget (FR)

(73) Assignee: Valeo Etudes Electroniques, Créteil Cedex (FR)

( * ) Notice: Subject to any disclaimer, the term of this patent is extended or adjusted under 35 U.S.C. 154(b) by 26 days.

(21) Appl. No.: 13/498,919

(22) PCT Filed: Oct. 7, 2010

(86) PCT No.: PCT/FR2010/052115
§ 371 (c)(1),
(2), (4) Date: Apr. 25, 2012

(87) PCT Pub. No.: WO2011/042667
PCT Pub. Date: Apr. 14, 2011

(65) Prior Publication Data
US 2012/0235290 A1    Sep. 20, 2012

(30) Foreign Application Priority Data

Oct. 7, 2009 (FR) ...................................... 09 57000

(51) Int. Cl.
| | |
|---|---|
| *H01L 23/34* | (2006.01) |
| *H05K 3/30* | (2006.01) |
| *H05K 7/00* | (2006.01) |
| *H01L 23/498* | (2006.01) |
| *H01L 23/00* | (2006.01) |
| *H01L 23/36* | (2006.01) |
| *H01L 25/18* | (2006.01) |
| *H01L 25/07* | (2006.01) |
| *H05K 1/14* | (2006.01) |
| *H01L 23/10* | (2006.01) |
| *H05K 3/00* | (2006.01) |

(52) U.S. Cl.
CPC .......... *H05K 1/144* (2013.01); *H01L 23/49833* (2013.01); *H01L 2224/02335* (2013.01);
(Continued)

(58) Field of Classification Search
USPC .................................................. 438/109, 127
See application file for complete search history.

(56) References Cited

U.S. PATENT DOCUMENTS

| | | | | |
|---|---|---|---|---|
| 5,199,164 A | * | 4/1993 | Kim et al. ........................ | 29/840 |
| 5,708,297 A | * | 1/1998 | Clayton ........................ | 257/723 |

(Continued)

FOREIGN PATENT DOCUMENTS

| | | |
|---|---|---|
| DE | 10 2006 018161 A1 | 10/2007 |
| EP | 0 886 315 A1 | 12/1998 |

(Continued)

OTHER PUBLICATIONS

International Search Report w/translation from PCT/FR2010/052115 dated Feb. 2, 2011 (6 pages).

*Primary Examiner* — David Zarneke
(74) *Attorney, Agent, or Firm* — Osha Liang LLP

(57) ABSTRACT

The invention relates to a power module (10), preferably for a vehicle, in particular an electric vehicle, characterized in that said module includes two vertically adjacent semiconducting chips (12, 14), each chip having a first surface (20, 22) to be connected to a heat sink substrate (24, 26), and a second surface (28, 30) separate from the first and on which at least one electronic component (38a-44b) is arranged, the module being arranged such that the second surfaces of the chips are arranged opposite one another.

17 Claims, 2 Drawing Sheets

Figure 1:
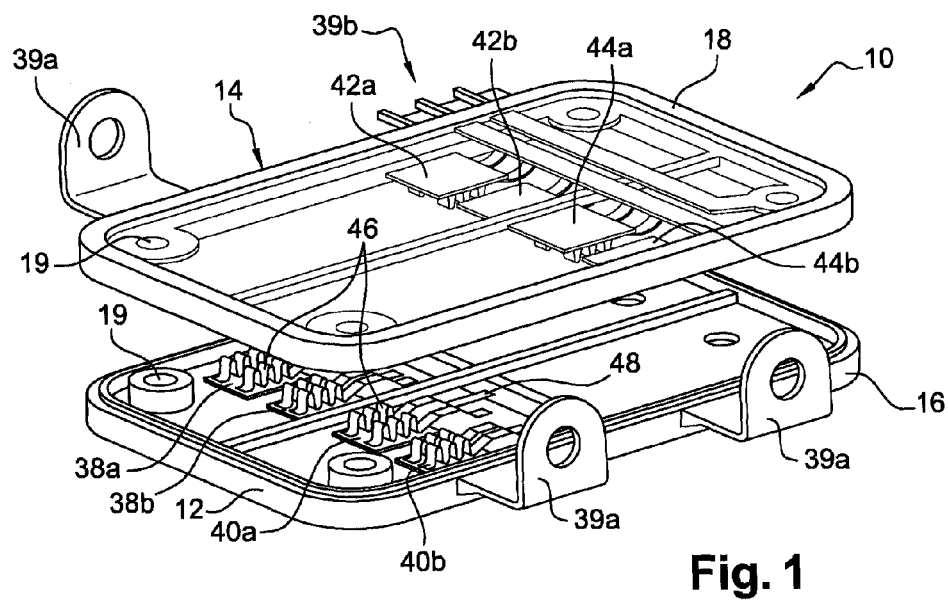

(52) U.S. Cl.
CPC ............... *H01L 23/10* (2013.01); *H01L 24/73*
(2013.01); *H01L 2924/01047* (2013.01); *H01L 2224/732* (2013.01); *H01L 2224/13099*
(2013.01); *H05K 2201/042* (2013.01); *H01L 2224/48091* (2013.01); *H01L 24/48* (2013.01);
*H01L 23/36* (2013.01); *H01L 2924/01058*
(2013.01); *H01L 25/18* (2013.01); *H01L 24/13*
(2013.01); *H01L 2224/0231* (2013.01); *H01L 2224/45014* (2013.01); *H05K 3/0061* (2013.01);
*H01L 2924/014* (2013.01); *H01L 24/16*
(2013.01); *H01L 25/074* (2013.01); *H01L 2224/0233* (2013.01); *H01L 2924/01033*
(2013.01); *H01L 24/72* (2013.01); *H01L 2924/13055* (2013.01); *H01L 2224/48227*
(2013.01); *H05K 2201/1053* (2013.01)
USPC ........... 257/712; 257/723; 438/109; 438/122; 361/735; 29/832

(56) References Cited

U.S. PATENT DOCUMENTS

| | | | |
|---|---|---|---|
| 5,714,802 A * | 2/1998 | Cloud et al. | 257/726 |
| 6,498,388 B2 * | 12/2002 | Kim et al. | 257/666 |
| 6,784,530 B2 * | 8/2004 | Sugaya et al. | 257/686 |
| 7,365,992 B2 * | 4/2008 | Lee | 361/800 |
| 7,443,023 B2 * | 10/2008 | Wehrly et al. | 257/707 |
| 7,446,410 B2 * | 11/2008 | Wehrly et al. | 257/707 |
| 7,459,784 B2 * | 12/2008 | Wehrly et al. | 257/707 |
| 7,606,050 B2 * | 10/2009 | Cady et al. | 361/783 |
| 7,616,452 B2 * | 11/2009 | Wehrly et al. | 361/803 |
| 7,692,291 B2 * | 4/2010 | Moon et al. | 257/707 |
| 7,737,549 B2 * | 6/2010 | Wehrly et al. | 257/707 |
| 7,911,792 B2 * | 3/2011 | Liang et al. | 361/699 |
| 8,017,438 B2 * | 9/2011 | Bauer et al. | 438/109 |
| 8,018,041 B2 * | 9/2011 | Do et al. | 257/686 |
| 8,039,973 B2 * | 10/2011 | Morelle et al. | 257/784 |
| 8,202,012 B2 * | 6/2012 | Stewart et al. | 385/88 |
| 8,351,794 B2 * | 1/2013 | Meadowcroft et al. | 398/139 |
| 2007/0153491 A1 | 7/2007 | Lee | |
| 2008/0105963 A1 | 5/2008 | Carlson et al. | |
| 2008/0165517 A1 | 7/2008 | Wang et al. | |
| 2010/0027941 A1 * | 2/2010 | Stewart et al. | 385/57 |
| 2010/0080518 A1 * | 4/2010 | Teo et al. | 385/92 |
| 2012/0243195 A1 * | 9/2012 | Lim et al. | 361/784 |

FOREIGN PATENT DOCUMENTS

| | | |
|---|---|---|
| EP | 1 381 115 A1 | 1/2004 |
| WO | 02/15268 A2 | 2/2002 |
| WO | 2007/085774 A1 | 8/2007 |

* cited by examiner

POWER MODULE FOR AN AUTOMOBILE

The present invention relates to a power module designed to be used for automobiles, notably for hybrid vehicles comprising an electric motor.

Power modules are electronic modules comprising a semiconductor wafer carrying electronic components in which high currents flow. This is notably the case when the power modules are intended for an application in hybrid vehicles, in which the currents used are of the order of 200 Amps.

As high-intensity currents are designed to flow in the power module, a significant amount of heat is generated by the latter. It is therefore very important to dissipate the heat to the periphery of the module in order to avoid overheating of the electronic components and a malfunction of the module.

In the prior art, a power module is already known that comprises a semiconductor wafer comprising a connection face on which electronic components are arranged and an opposing face for heat dissipation, electrically connected to a substrate allowing the heat to be dissipated. Such a module does not however dissipate enough heat to be able to operate correctly when high-intensity currents, necessary in the case of hybrid vehicles, are flowing in the latter.

A power module is also known from the prior art, notably from the document EP 1 381 115, comprising a housing enclosing a semiconductor wafer, comprising a first connection face on which electronic components are arranged and a second opposing face, directly in contact with a substrate for dissipation of the heat. The housing also comprises springs connected to the connection face and providing an electrical link between this face and a device for controlling and regulating the temperature.

Such a power module thus has a structure allowing heat to be dissipated from the two faces of the semiconductor wafer, higher currents then being able to flow in the power module.

However, such a power module has a specific architecture being relatively bulky and comprising a relatively high number of components, these components being furthermore specific components.

The aim of the invention is notably to provide a power module allowing a significant dissipation of heat, such that high-intensity currents can flow in the latter without damaging the components, while at the same time being of simple design.

For this purpose, one subject of the invention is a power module, preferably for a vehicle, notably an electric vehicle, comprising two superposed semiconductor wafers, each wafer comprising a first face, forming a heat dissipation face and designed to be connected to a heat dissipating substrate, and a second face, distinct from the first, forming a connection face and on which at least one electronic component is arranged, the module being configured in such a manner that the second faces of the wafers are disposed facing each other.

Accordingly, the heat from the module can be dissipated from the two faces of the latter in a very efficient manner since, as neither of the two faces designed for heat dissipation carries electronic components, the substrate allowing the heat dissipation can be in direct contact with the entirety of the dissipation face.

Furthermore, the components of the semiconductor wafers can be connected via conventional means and the assembly of the module does not present any particular difficulties. In particular, specific elements are not needed in order to connect each semiconductor wafer to the other of the semiconductor wafers. Similarly, since the heat dissipation face of each of the wafers does not carry any components, the connection of this face with the substrate can be effected in a simple manner without the aid of specific components.

Thus, such a module, although of simple design and for this reason economical, allows the heat to be dissipated from two faces of the latter and the intensity of the current flowing in the power module to be significantly increased without the risk of damaging the latter.

The invention also comprises one or more of the features from the following list:
- the or at least one of the electronic components is chosen from between a diode or a transistor,
- the second face of each wafer comprising at least one connector, the module comprises at least one connection element for connecting an electronic component or a connector of one of the wafers to an electronic component or a connector of the other of the wafers. A single circuit is thus composed on both semiconductor wafers, the distribution of the various components over the semiconductor wafers allowing the dissipation of heat to be optimized.
- the or at least one of the connection elements consists of a ribbon cable. Such a ribbon cable is used for power connections and allows the transmission of the power between the various components to be optimized. In particular, the ribbon cable is made to undulate so as to exhibit alternating opposing arches, at least one peak of a first type of arch being electrically connected to the second face of one of the wafers and at least one peak of a second type of arch being electrically connected to the second face of the other of the wafers, which allows the path between the connectors and/or the electronic components to be minimized, and, accordingly, the heat losses when the current flows in the ribbon cable to be limited,
- each wafer comprises, at at least two of its opposing ends, a spacing support element, the module being configured such that the spacing support elements are in contact and that a space remains between the second faces of the wafers. In this way, the design of the module is facilitated, the space remaining between the two faces allowing the electronic components and the connection elements to be inserted more easily onto the wafers. In addition, owing to the spacing support elements, the thickness of the space formed between the wafers is able to be precisely controlled and overheating of the module due to there being too small a distance between the wafers to be avoided,
- the spacing support elements comprise means for locking the wafers in their relative positions, notably comprising abutted surfaces with complementary shapes. Thanks to such means, the two wafers can be positioned more easily relative to one another and the process of assembly of the module is thus simplified. Costs of manufacturing of the module can thus be reduced. Advantageously, these means can consist of complementary mating surfaces, because the positioning means are in this case inexpensive to fabricate.
- at least one of the wafers has a frame made of a plastic material, this frame preferably comprising the spacing support elements. Thus, the module can be compact and contiguous with the electronic component mechanically protected from potential external aggressions thanks to the plastic frame.
- the module may also comprise means for fixing the spacing support elements and/or the frames, where these means can be screw fixing means, the frames or spacing support elements then having opposing holes for receiving fixing screws.

Another subject of the invention is an assembly of a power module according to the invention and of two substrates for dissipation of the heat, each of the substrates being respectively electrically connected to the first face of one of the wafers, preferably in direct contact with the first face of one of the wafers. The substrates can be connected to the module via a conducting surface, notably a metalized surface, formed by conventional methods such as silver paste sintering or bead brazing.

Another subject of the invention is a method for assembling a power module, comprising the following operations:
the module comprising two semiconductor wafers, at least one electronic component is placed on one face referred to as connection face of each of the wafers,
the wafers are superposed in such a manner that the connection faces are placed facing each other.

Such a method allows the module according to the invention to be fabricated. The connection face corresponds, as those skilled in the art will have understood, to the second face of the module.

The method according to the invention may also comprise the following steps:
at least one connection element, preferably a ribbon cable, on the connection face of one of the wafers and
the wafers are superposed in such a manner that the connection element electrically connects at least one connector of the second face of the wafer or an electronic component, arranged on said face, to a connector of the second face of the other wafer or an electronic component arranged on said face.

Figure 2:
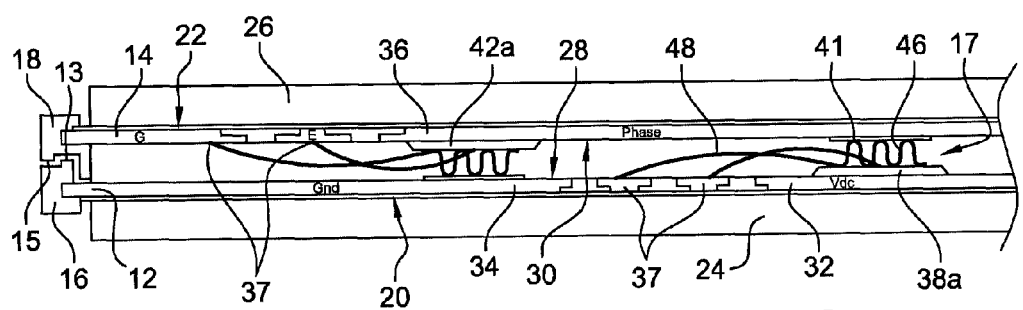
Figure 3:
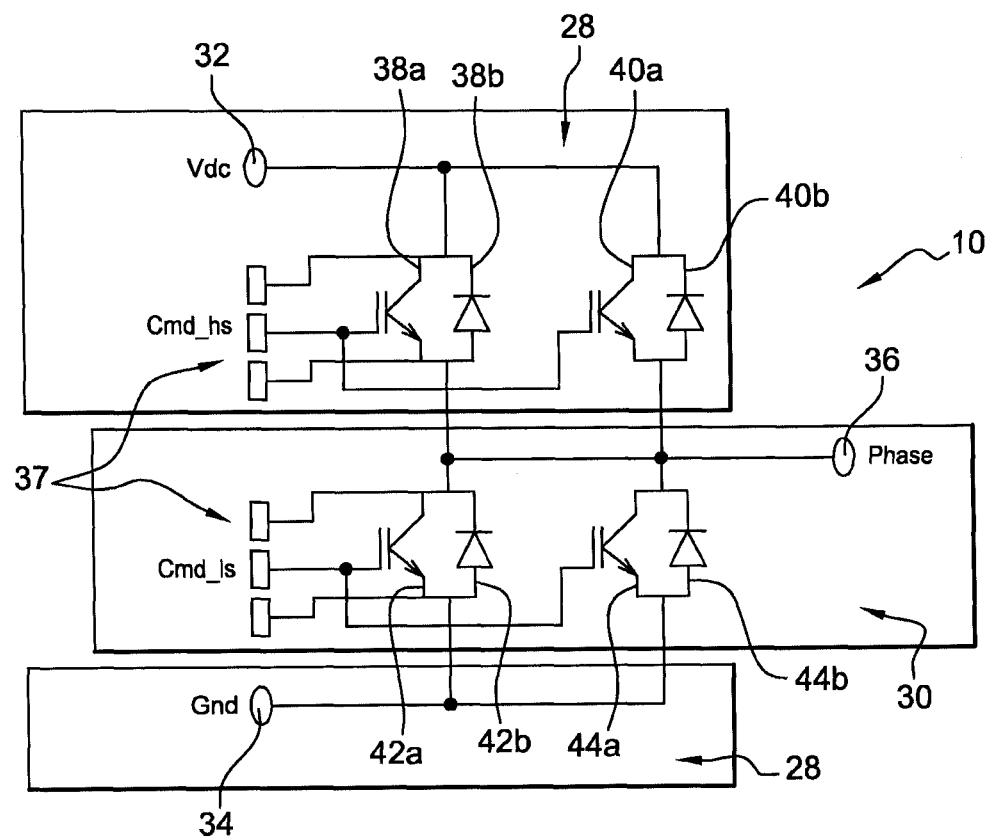

The invention will be better understood upon reading the description that follows, presented solely by way of example and with reference to the drawings in which:

FIG. 1 is a perspective and exploded view of a power module according to one embodiment of the invention, FIG. 2 is a schematic cross-sectional view of an assembly comprising the power module in FIG. 1, FIG. 3 is a view of an electrical diagram of the circuit of the power module in FIGS. 1 and 2.

In the figures, a power module 10 according to the invention is shown. As can be seen in FIGS. 1 and 2, such a module 10 comprises two semiconductor wafers 12 and 14, respectively denoted lower wafer 12 and upper wafer 14. These wafers 12, 14 are composed of conducting circuits onto which plastic material is molded. A frame 16, 18 also surrounds each of the wafers 12, 14. This frame is made of plastic material and is also molded onto the conducting circuits of the wafer.

The frames 16, 18 are placed one on top of the other and form spacing support elements allowing the wafers 12 and 14 to be arranged such that they are superposed, as can notably be seen in FIG. 2. The shape of the frames is matched so as to leave a space 17 between the two superposed wafers, the thickness of the space being determined by the shape and the dimensions of the frames 16, 18.

As can also be seen in FIG. 2, at their lower and respectively their upper end, the frames have complementary shapes, the faces of these shapes forming abutted surfaces 13, 15 allowing the frames 16, 18 to be positioned more efficiently and more easily with respect to one another.

The module also comprises means 19 for fixing the two frames with respect to one another, as can be seen in FIG. 1. These means comprise superposed orifices disposed at each corner of the frame 16, 18 into which a fixing element, such as a screw, is intended to be engaged.

Each wafer 12, 14 comprises a first face 20, 22 designed to be brought into contact with a heat dissipating substrate 24, 26, as can be seen in FIG. 2. This face is accordingly covered over its entire surface with an electrically insulating, but thermally conducting, film allowing the dissipation of the heat while at the same time making the module safe. These faces form the external faces of the module.

Each wafer 12, 14 also comprises a second face 28, opposing the first face, designed to receive electronic components and called connection face. The module is configured in such a manner that the faces 28, 30 of the two wafers 12, 14 are opposing each other and bound the space 17 situated between the two wafers.

Each wafer comprises power connectors on its connection face, the power supply connector 32 and the ground connector 34 on the lower wafer 12 and the phase connector 36 on the upper wafer 14, respectively. It also comprises control and detection connectors 37. As can be seen in FIG. 1, the module comprises lugs 39a, made of metal and protruding from the module. These lugs allow the power connectors of the module to be electrically connected to other elements situated outside of the module and the latter to be integrated into a more global circuit. The module also comprises pins 39b for connecting the control connectors to an external circuit.

Electronic components 38a, 38b, 40a, 40b, 42a, 42b, 44a, 44b are also arranged on the connection faces 28, 30 of the wafers 12, 14. Each wafer 12, 14 comprises in particular two IGBT transistors, respectively 38a, 40a for the wafer 12 and 42a, 44a for the wafer 14 and two diodes, respectively 38b, 40b for the wafer 12 and 42b, 44b for the wafer 14. These components are soldered onto the connection face 28, 30 of each of the wafers 12, 14.

Connection elements 46, 48 are also installed on the connection faces for connecting the connectors and/or the electronic components together. The connection elements comprise power ribbon cables 46 and control wires 48.

Two ribbon cables 46 are notably arranged on each electronic component 38a-44b of a wafer for connecting the latter to a power connector of the other wafer. The ribbon cables 46 are more particularly undulated so as to exhibit alternating opposing arches, the peaks of a first type of arch being electrically connected to the component and the peaks of a second type of arch being electrically connected to a power connector of the other of the wafers, with the interposition of a metal element 41. For example, as can be seen in FIG. 2, a ribbon cable 46 electrically connects the transistor 38a of the wafer 12 to the phase connector 36 of the wafer 14. Another ribbon cable electrically connects the transistor 42a of the wafer 14 to the ground connector 34 of the wafer 12.

The module also comprises control wires 48 each connecting transistors 38a-44a to the control connectors 37.

The electronic component in this example of this embodiment is more particularly shown in FIG. 3. This is a conventional half-bridge circuit, comprising a plurality of transistors 38a, 40a and 42a, 44a, each transistor being connected in parallel with a diode 38b, 40b, and 42b, 44b, respectively. Two transistor-diode pairs, mounted onto the connection face 28 of the wafer 12, are installed between the power supply connector 32 and phase connector 36, whereas two other pairs, mounted onto the connection face 30 of the wafer 14, are installed between the phase connector 36 and the ground connector 34. The transistors 38a, 40a of the wafer 12, together with the transistors 42a, 44a of the wafer 14, are controlled in the same manner by means of the control and detection connectors 37, the multiplication of the transistors allowing, above all, the currents flowing in each transistor and the heat dissipated by the module to be distributed.

In this circuit, the transistors 38a-44a operate as switches which are alternately opened and closed. The diodes 38b-44b form flywheel diodes which allow the over-voltage in the circuit to be limited when a control command is sent to the transistor to act as an opening switch. Such a configuration allows positive and negative alternations in voltage to be supplied at the output. At the input, it is generally connected to an electrical battery of the vehicle and, at the output, to the electric motor of the vehicle.

Such a module allows an efficient dissipation of the heat, because two of its faces can be connected to substrates allowing the heat to be dissipated. Furthermore, it is of simple design and does not require the use of specific connection elements. Moreover, such a module takes up very little space.

The method for fabrication of a module such as previously described will now be described. First of all, the conducting circuits are placed into a mold and plastic material is molded onto the latter, in such a manner as to obtain two semiconductor wafers 12 and 14, each one surrounded by a frame 16, 18.

Next, the various electronic components 38a, 38b, 40a, 40b, 42a, 42b, 44a, 44b are placed onto the respective wafers 12 and 14, and the various components are soldered onto the appropriate conducting circuits of the wafers 12 and 14. Subsequently, the control wires 48 and the ribbon cables 46 are placed onto the wafers as indicated above, and these are electrically connected to the connectors and/or to the electrical components by ultrasound welding.

Then, metal elements 41 are positioned at the peak of the ribbon cables 46 of the wafer 12 and onto the connectors of this wafer designed to receive the peak of the lower arches of the ribbon cables of the upper wafer 14. The wafer 14 is subsequently installed on the wafer 12 such that the two wafers 12 and 14 are superposed by means of the abutted surfaces 13, 15.

Each ribbon cable 46 is then soldered to the wafer to which it had not up to now been connected. The heat dissipation face 20, 22 of each wafer is then covered with an electrically insulating, but thermally conducting, film so as to avoid any conduction of electricity to the outside of the module by other channels than the lugs and pins 39a, 39b.

A resin is then injected into the space 17 formed between the two wafers 12, 14 so as to protect the components from external elements.

The two wafers 12, 14 are then fixed together by means of screw attachment elements.

The wafers 12, 14 can subsequently be assembled, each one via its first face 20, 22, to a substrate 24, allowing the heat to be dissipated and these substrates can be fixed to the module in such a manner that they are in direct contact against the heat dissipation face 20, 22 of the wafers. An assembly according to one embodiment of the invention is thus obtained.

It will be noted that the invention is not limited to the embodiment previously described.

First of all, the electronic components placed onto the wafers are not limited to the components described. In order to form the half-bridge circuit, it could perfectly well be envisioned that a single transistor-diode pair be placed onto each of the wafers. It may also be envisioned that another type of circuit be integrated into such a power module.

Similarly, the connection elements are not limited to what has been described. The module does not need to comprise power ribbon cables, for example. It could equally comprise a larger number of power ribbon cables per component.

Furthermore, the shape of the module is not limited to what has been described. The module does not need to comprise a frame surrounding the latter or abutted surfaces allowing the correct positioning of the wafers with respect to one another. The module may equally be fixed by other means than screw attachment means.

The external faces of the module are not necessarily in direct contact over their whole surface with a heat dissipating substrate. Furthermore, the two wafers of the module may be assembled using the same means as those used to assemble the module to the substrates.

In addition, it will be noted that the method is not necessarily limited to what has been described. Certain steps of the latter may, for example, be reversed.

The invention claimed is:

1. A power module for an electric vehicle, the power module comprising:
    two superposed semiconductor wafers, each wafer comprising a first face, configured to be connected to a heat dissipating substrate, and a second face, distinct from the first, on which at least one electronic component is arranged,
    wherein the second faces of the two superposed semiconductor wafers are disposed facing each other,
    wherein each of the two superposed semiconductor wafers comprises a frame that surrounds each corresponding superposed semiconductor wafer, the frame being molded onto each corresponding superposed semiconductor wafer, and
    wherein the two semiconductor wafers are superposed by each frame forming a spacing support element, the spacing support element allowing the superposed arrangement of the two semiconductor wafers.

2. The power module as claimed in claim 1, wherein the second face of each wafer comprises at least one connector, and wherein the module further comprises at least one connection element for connecting an electronic component or a connector of one of the wafers, to an electronic component or a connector of the other of the wafers.

3. The power module as claimed in claim 2, in which at least one of the connection elements consists of a ribbon cable.

4. The power module as claimed in claim 3, in which the ribbon cable is made to undulate to exhibit alternating opposing arches, at least one peak of a first type of arch being electrically connected to the second face of one of the wafers, and at least one peak of a second type of arch being electrically connected to the second face of the other of the wafers.

5. The power module as claimed in claim 1, the module being configured such that the spacing support elements are in contact and that a space remains between the second faces of the two superposed semiconductor wafers.

6. The power module as claimed in claim 5, in which the spacing support elements comprise mating surfaces with complementary shapes for locking the wafers in their relative positions.

7. A power module assembly comprising a power module as claimed in claim 1 and an assembly of two heat dissipating substrates, each of the heat dissipating substrates being respectively electrically connected to the first face of one of the wafers in direct contact with the first face of one of the wafers.

8. An assembly method for a power module comprising two semiconductor wafers, the assembly method comprising:
    placing at least one electric component onto a connection face of each of the two semiconductor wafers, wherein the connection face of each wafer is one of two faces of each wafer, wherein each of the two semiconductor wafers comprises a frame that surrounds each corresponding superposed semiconductor wafer, the frame being molded onto each corresponding semiconductor wafer, and wherein each frame comprises a spacing support element; and superposing the spacing support elements of the two semiconductor wafers so that the connection faces of each wafer are placed opposing each other.

9. The method as claimed in claim 8, in which at least one connection element comprising a ribbon cable, is placed on the connection face of one of the two semiconductor wafers, and wherein the wafers are superposed in such a manner that the connection element electrically connects at least one connector of the connection face of the wafer or an electronic component arranged on the connection face, to a connector of the connection face of the other wafer or an electronic component arranged on the connection face of the other wafer.

10. A power module for an electric vehicle, the power module comprising:

two superposed semiconductor wafers, each wafer comprising a first face, configured to be connected to a heat dissipating substrate, and a second face, distinct from the first, on which at least one electronic component is arranged, wherein the second faces of the two superposed semiconductor wafers are disposed facing each other, wherein the second face of each wafer comprises at least one connector; and at least one connection element installed on an inner portion of the connection faces for connecting an electronic component or a connector of one of the wafers to an electronic component or a connector of the other of the two wafers.

11. The power module as claimed in claim 10, wherein the at least one of the connection elements comprises a ribbon cable.

12. The power module as claimed in claim 11, wherein the ribbon cable is made to undulate so as to exhibit alternating opposing arches, at least one peak of a first type of arch is electrically connected to the second face of one of the two wafers, and at least one peak of a second type of arch is electrically connected to the second face of the other of the two wafers.

13. A power module for an electric vehicle, the power module comprising:

two superposed semiconductor wafers, each wafer comprising a first face, configured to be connected to a heat dissipating substrate, and a second face, distinct from the first, on which at least one electronic component is arranged, wherein the second faces of the two superposed semiconductor wafers are disposed facing each other, wherein at least one of the two wafers is formed by connectors organized in a plane and over molded by plastic material, wherein the second face of each wafer comprises at least one of said connectors, and wherein the module further comprises at least one connection element for connecting an electronic component or said at least one connector of one of the two wafers to an electronic component or said at least one connector of the other of the two wafers.

14. The power module as claimed in claim 13, wherein the connection element is installed on the second faces for connecting an electronic component or said at least one connector of one of the two wafers to an electronic component or said at least one connector of the other of the two wafers.

15. The power module as claimed in claim 1, wherein the spacing support elements of the two wafers comprise mating surfaces with complementary shapes for locking the wafers in their relative position, and wherein the spacing support elements of the two wafers further mate with a surface of the wafer.

16. A power module assembly comprising a power module as claimed in claim 10 and an assembly of two heat dissipating substrates, each of the heat dissipating substrates being respectively electrically connected to the first face of one of the wafers in direct contact with the first face of one of the wafers.

17. A power module assembly comprising a power module as claimed in claim 13 and an assembly of two heat dissipating substrates, each of the heat dissipating substrates being respectively electrically connected to the first face of one of the wafers in direct contact with the first face of one of the wafers.

* * * * *